(12) United States Patent
Quiquempoix

(10) Patent No.: US 9,154,155 B2
(45) Date of Patent: Oct. 6, 2015

(54) 2-PHASE SWITCHED CAPACITOR FLASH ADC

(71) Applicant: Microchip Technology Incorporated, Chandler, AZ (US)

(72) Inventor: Vincent Quiquempoix, Divonne les bains (FR)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/181,904

(22) Filed: Feb. 17, 2014

(65) Prior Publication Data

US 2014/0240155 A1    Aug. 28, 2014

Related U.S. Application Data

(60) Provisional application No. 61/769,928, filed on Feb. 27, 2013.

(51) Int. Cl.
| | |
|---|---|
| *H03M 3/00* | (2006.01) |
| *H03K 5/15* | (2006.01) |
| *H03M 1/00* | (2006.01) |
| *H03M 1/80* | (2006.01) |
| *H03M 1/12* | (2006.01) |

(52) U.S. Cl.
CPC ............... *H03M 3/322* (2013.01); *H03K 5/15* (2013.01); *H03M 3/34* (2013.01); *H03M 1/00* (2013.01); *H03M 1/12* (2013.01); *H03M 1/804* (2013.01); *H03M 3/30* (2013.01); *H03M 3/356* (2013.01); *H03M 3/422* (2013.01)

(58) Field of Classification Search
CPC .......... H03M 3/30; H03M 1/804; H03M 1/12; H03M 1/00
USPC ........................... 341/143, 172, 120, 155, 156
See application file for complete search history.

(56) References Cited

U.S. PATENT DOCUMENTS

| | | |
|---|---|---|
| 6,972,705 B1 | 12/2005 | Fei et al. .................... 341/143 |
| 2006/0132341 A1 | 6/2006 | Koh et al. .................. 341/143 |

(Continued)

FOREIGN PATENT DOCUMENTS

EP       0562564 A2    9/1993    ............. H03M 1/06

OTHER PUBLICATIONS

Léger, Gildas et al., "On Chopper Effects in Discrete-Time ΣΔ Modulators," IEEE Transactions on Circuits and Systems—I: Regular Papers, vol. 57, No. 9, 12 pages, Sep. 1, 2010.

(Continued)

*Primary Examiner* — Joseph Lauture
(74) *Attorney, Agent, or Firm* — Slayden Grubert Beard PLLC

(57) ABSTRACT

An input stage for a switched capacitor analog-to-digital converter has a differential voltage input receiving an input voltage, a differential reference voltage input receiving a chopped reference voltage, a common voltage connection, and a differential output. A pair of input capacitors is coupled between the differential voltage input and the differential output and a pair of reference capacitors is coupled between the differential reference voltage input. A switching unit is controlled by a first and second phase operable during the first phase to connect a first terminal of the input capacitors with the common voltage connection and couple the first terminal of the reference capacitors with the inverted differential voltage reference; and during a second phase to connect the first terminal of the input capacitors with the differential input voltage and couple the first terminal of the reference capacitors with the non-inverted differential voltage reference.

15 Claims, 4 Drawing Sheets

(56) References Cited

U.S. PATENT DOCUMENTS

| | | | |
|---|---|---|---|
| 2011/0063146 A1 | 3/2011 | Matthews et al. | 341/118 |
| 2011/0163901 A1 | 7/2011 | Quiquempoix et al. | 341/143 |
| 2011/0193736 A1* | 8/2011 | Buter et al. | 341/172 |

OTHER PUBLICATIONS

International Search Report and Written Opinion, Application No. PCT/US2014/017262, 14 pages, May 23, 2014.

* cited by examiner

2-PHASE SWITCHED CAPACITOR FLASH ADC

CROSS-REFERENCE TO RELATED APPLICATIONS

This application claims the benefit of U.S. Provisional Application No. 61/769,928 filed on Feb. 27, 2013, which is incorporated herein in its entirety.

TECHNICAL FIELD

The present disclosure relates to a 2-phase switched capacitor Flash analog-to-digital-converter (ADC), in particular a Flash ADC using a chopper voltage reference.

BACKGROUND

A block diagram of a conventional switched capacitor analog-to-digital-converter 100 (ADC) is shown in FIG. 1. An input signal to be converted is fed through a loop filter 110 to a quantizer 120 in which the signal is generally converted into an output bit stream having 1-bit or multiple bit resolution. The output signal is fed back through a digital-to-analog converter 130 (DAC) to the loop filter 110 where it is subtracted from the input signal.

This type of analog-to-digital converter introduces quantization noise and offset errors. In particular a reference voltage is used within the quantizer which introduces an offset voltage and therefore distorts the measured signal.

SUMMARY

There exists a need for an improved design of a switched capacitor DAC. According to an embodiment, an input stage for a switched capacitor analog-to-digital converter may comprise a differential voltage input receiving an input voltage, a differential reference voltage input receiving a chopped reference voltage, a common voltage connection, a differential output, a pair of input capacitors coupled between the differential voltage input and the differential output, a pair of reference capacitors coupled between the differential reference voltage input, and a switching unit controlled by a first and second phase operable during the first phase to connect a first terminal of the input capacitors with the common voltage connection and couple the first terminal of the reference capacitors with the inverted differential voltage reference; and during a second phase to connect the first terminal of the input capacitors with the differential input voltage and couple the first terminal of the reference capacitors with the non-inverted differential voltage reference.

According to a further embodiment, the first and second phase are defined by non-overlapping clock signals. According to a further embodiment, the reference voltage is chopped using the non-overlapping clock signals. According to a further embodiment, the reference voltage comprises a positive offset voltage during one phase and a negative offset voltage during the other phase. According to a further embodiment, during the first phase the second terminals of the input capacitors are coupled with a common voltage connection. According to a further embodiment, during the first phase the second terminals of the input capacitors are coupled with a negative input voltage. According to a further embodiment, the first terminal of a positive input capacitor and the first terminal of a positive reference capacitor are coupled with a positive output terminal and the first terminal of a negative input capacitor and the first terminal of a negative reference capacitor are coupled with a negative output terminal. According to a further embodiment, the common voltage connection is ground. According to a further embodiment, the common voltage connection is a virtual ground.

According to yet another embodiment, a method of providing an input signal to a quantizer of a sigma delta modulator having an input stage with a pair of input capacitors and a pair of reference capacitors, wherein a first terminal of each of the input capacitors and reference capacitors is connected with a positive and negative output terminal, respectively, may comprise during a first phase connecting the positive and negative output terminals with a common voltage and charging the reference capacitors with an inverted reference voltage; and during a subsequent second phase disconnecting the positive and negative output terminals from the common voltage and connecting the first terminals of the input capacitors with a non-inverted differential input voltage, respectively and the first terminals of the reference capacitors with the non-inverted reference voltage.

According to a further embodiment of the method, the first and second phase are defined by a non-overlapping clock signals. According to a further embodiment of the method, According to a further embodiment of the method, the reference voltage can be chopped using the non-overlapping clock signals. According to a further embodiment of the method, the reference voltage comprises a positive offset voltage during one phase and a negative offset voltage during the other phase. According to a further embodiment of the method, during the first phase the second terminals of the input capacitors are coupled with the common voltage. According to a further embodiment of the method, during the first phase the second terminals of the input capacitors are coupled with an inverted input voltage. According to a further embodiment of the method, the common voltage connection is ground. According to a further embodiment of the method, the common voltage connection is a virtual ground.

DETAILED DESCRIPTION

According to various embodiments, a 2-phase switched capacitor Flash ADC using a chopper voltage reference can be provided wherein the voltage reference is averaged within the Flash ADC. The present disclosure solves the problem how to be able to use a chopper voltage reference in a 2-phase switched capacitor based Flash ADC without being impacted by the offset of the voltage reference and without additional circuitry to average the chopper voltage reference.

Figure 1:
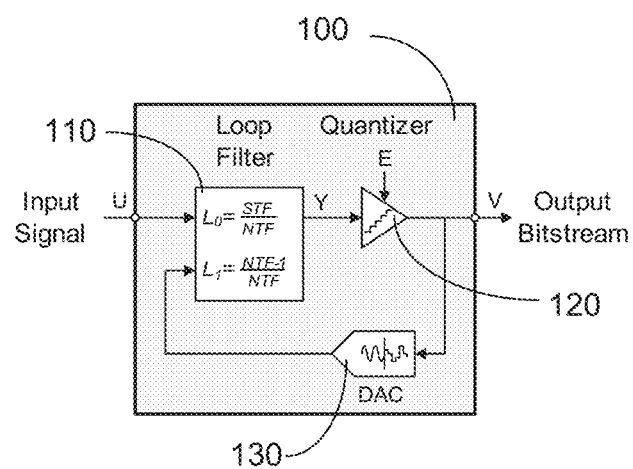
FIG. 1 shows a block diagram of a sigma delta modulator.

In sigma delta converters as for example shown in FIG. 1, Flash ADCs are often used to make the quantizer for multi level modulators. These Flash ADCs are often capacitive based where there is a switching network that samples the signal and the reference followed by a comparator that compares if the resulting sampled signal is higher than the threshold given by the reference voltage.

The Flash ADC often uses two phases (one reset phase and one compare phase) to be able to reset the capacitor charges between two independent comparisons. The voltage reference is often coming from a chopper voltage reference source to avoid 1/f noise and offset errors in the reference signal.

According to various embodiments, a 2 phase switched capacitor Flash ADC using a chopper voltage reference can be provided in which the voltage reference is averaged within the Flash ADC, so that no low pass filter is required to average the chopper signals. This also permits to have reference capacitors twice smaller in the Flash ADC. This will remove the need for having an un-buffered and not chopped voltage reference signal as the reference source for the Flash ADCs and therefore simplifies the design of multi-level modulators too.

A conventional Flash ADC is composed of multiple comparator stages (n comparators for n+1 levels for the ADC resolution). In each stage, each of the comparator stage is typically driven by a switched-capacitor circuit, as shown for example shown in FIG. 2.

This circuit is a differential input stage that has Vin+/− for the input signal and Vref+/− for the reference signal and VCM for a common-mode virtual ground or ground signal. Switch 210a connects Vin+ with a first terminal of capacitor 230a whose second terminal is coupled with the output terminal OP. Switch 215a connects Vref+ with a first terminal of capacitor 240a whose second terminal is coupled with the output terminal OP. Switch 215b connects Vref− with a first terminal of capacitor 240b whose second terminal is coupled with the output terminal OM. Switch 210b connects Vin− with a first terminal of capacitor 230b whose second terminal is coupled with the output terminal OM.

Switches 220a-d are provided to couple the first terminal of capacitors 230a, 240a, 240b, and 230b with VCM. Switches 250a and 250b connect the output terminals OP and OM with VCM and switch 260 connects OP and OM. Switches 220a-d, 250a, b and 260 are controlled by clock signal P1 and switches 210a, b and 215a, b are controlled by clock signal P2.

The outputs OP/OM are connected to a comparator (respectively positive and negative side). Typically here the circuit works in two phases P1 and P2 (non overlapping phases/clock signals) to transfer the charges to the comparator. In the P1 phase, the switches connected to OP/OM are on and the top plate and the bottom plate of all the caps are reset to VCM. No charge is transferred to the comparator. The input switches connected to $V_{in}$+/− and $V_{ref}$+/− are opened. OP=OM=VCM in this phase. This is the RESET phase.

In phase P2, the transfer happens, hence this is the TRANSFER phase. The input switches 210a, b and 215a, b are on, so each input is sampled on their respective capacitors 230a, b and 240a, b. The switches 250a, b and 260 connected to OP/OM are opened so the OP/OM signals are no more reset to VCM. Their value depends on the $V_{in}$+/− and Vref+/− and the capacitor values. The OP−OM differential voltage gets positive if Cin(Vin+−Vin−)−Cref(Vref+−Vref−)>0 which means Vin+−Vin−>Cref/Cin*(Vref+−Vref−). So the effective comparator threshold for the differential voltage input Vin+−Vin− is Cref/Cin (Vref+−Vin−). Each of the comparator stage typically has a different comparator threshold, set by the Cref capacitor value and equally distributed to have a uniform quantization error. A negative threshold is simply realized in swapping Vref+ and Vref− at the inputs.

Figure 2:
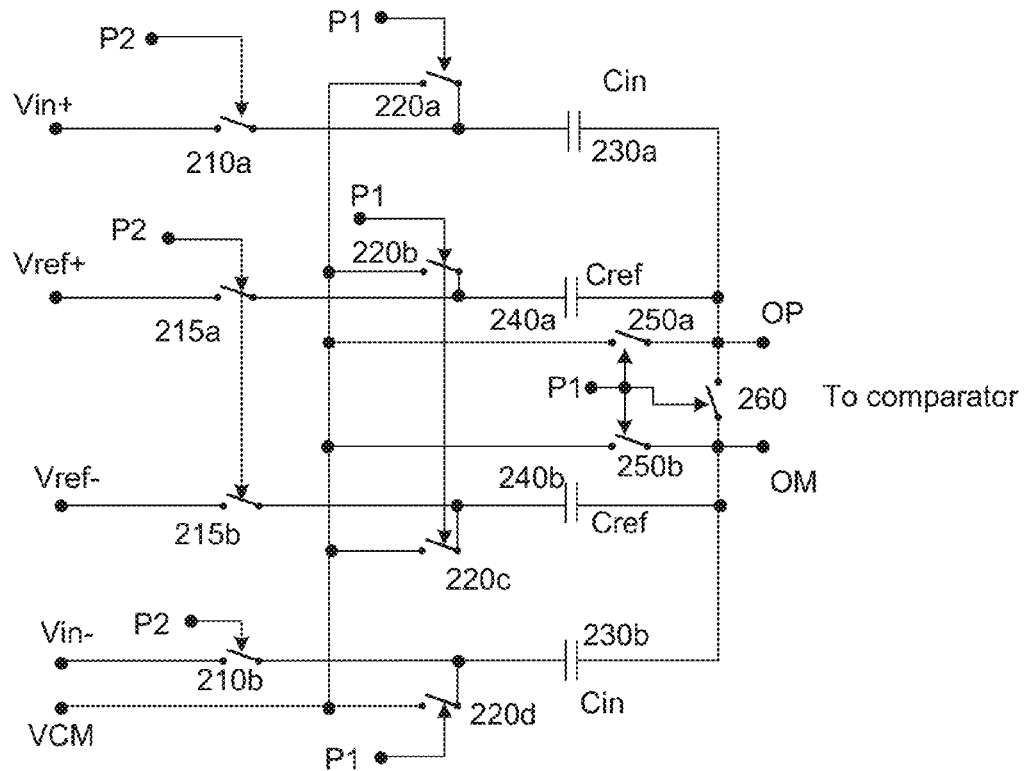
FIG. 2 shows a conventional Flash ADC stage.
Figure 3:
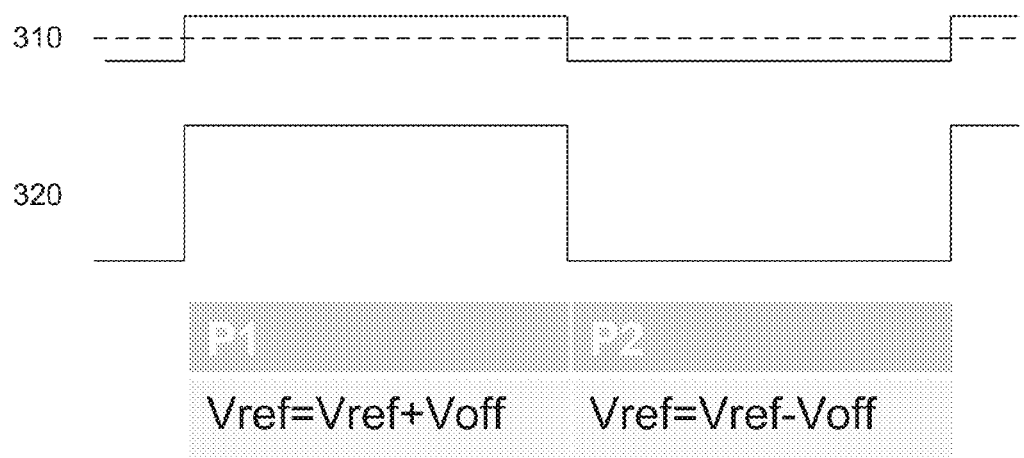
FIG. 3 shows a chopped reference voltage.

This conventional stage as shown in FIG. 2 has a problem when the Vref+/− include a chopper modulation even if the modulation is happening between P1 and P2 which is a natural approach. If Vref+−Vref−=Vref+Voff is written in phase P1 and Vref−Voff in phase P2, a model is obtained for the voltage reference that is chopped between P1 and P2 and that has an offset of Voff and an average of Vref as shown in FIG. 3.

In the conventional stage, the Vref transfer (at the Vref+/− inputs) only happens in P2. So it always transfers Vref−Voff in the case of a chopper modulated voltage reference. So in this case, the proper averaging is never realized and the Vref offset is always integrated in the output charge which is not the purpose of the chopper modulation.

Figure 4:
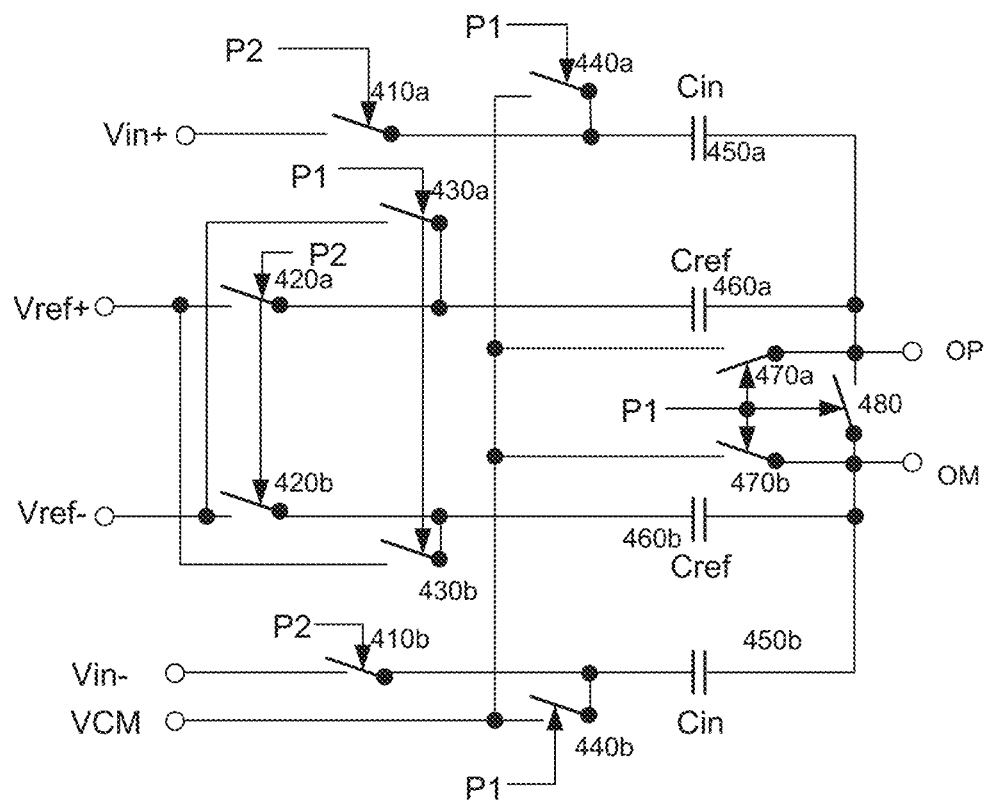
FIG. 4 shows an input stage for a sigma delta modulator according to a first embodiment.

FIG. 4 shows an improved input stage for a switched capacitor ADC according to various embodiments. Switch 410a connects Vin+ with the first terminal of capacitor 450a whose second terminal is coupled with output OP. Switch 420a connects Vref+ with the first terminal of capacitor 460a whose second terminal is coupled with output OP. Switch 420b connects Vref− with the first terminal of capacitor 460b whose second terminal is coupled with output OM. Switch 410b connects Vin− with the first terminal of capacitor 450b whose second terminal is coupled with output OM. Switches 440a and 440b are provided to couple the first terminals of capacitors 450a and 450b with VCM. Switches 470a and 470b are provided to couple the outputs OP and OM with VCM and switch 480 shorts outputs OP and OM. Switch 430a is provided to connect Vref− to the first terminal of capacitor 460a and switch 430b is provided to connect Vref+ with the first terminal of capacitor 460b. Switches 440a, b, 430a, b, 470a, b, and 480 are controlled by clock signal P1. Switches 410a, b and 420a, b are controlled by clock signal P2.

In the proposed structure according to various embodiments, as shown in the FIG. 4, there are no more switched connections to VCM on the Vref input switches. The switches 420a,b and 430a, b are now in a cross configuration and are connected to either Vref+ or Vref−. A set of switches 430a, b connects the capacitors 460a, b to Vref+/− in phase P1 and a complement set of switches 420a, b connects to the opposite Vref−/+ in phase P2. So the total amount of charge transferred on the reference capacitors Cref is then:
 −Cref(Vref+−Vref−) in phase P1, and
 Cref(Vref−−Vref+) in phase P2.

In case of a chopped reference input that is toggled between P1 and P2, we can write: Vref+−Vref−=Vref+Voff in phase P1 and Vref−Voff in phase P2, the total charge transferred is: Charge (P2)−Charge (P1)=Cref{Vref+Voff)−(−Cref(Vref−Voff))=2*Cref*Vref. In this total sum, the Voff component is cancelled, due to the demodulation of the chopper done at the Vref+/− inputs with the switches 420a, b and 430a, b connected in a cross configuration on P1 and P2. This means that the reference has been averaged between the two phases through the capacitor charge integration and the comparison result is thus independent of the voltage reference offset which is solving the conventional ADC problem. The input signal capacitors Cin are not changed in this configuration but can also be set in a cross configuration to gain a factor of 2× in the sampled signal (as long as the input signal is available during the two phases which may not always be true). With this new technique, a gain of 2× is realized in the Vref path, so the Cref can be divided by two to keep the same effective threshold, which is beneficial for settling time issues and die size. The amount of switches is still the same than in a conventional configuration so there is no real apparent drawback. The chopper modulation just needs to be synchronous with the phases P1 and P2 and the toggling needs to happen between P1 and P2 to realize the proper offset cancellation.

Figure 5:
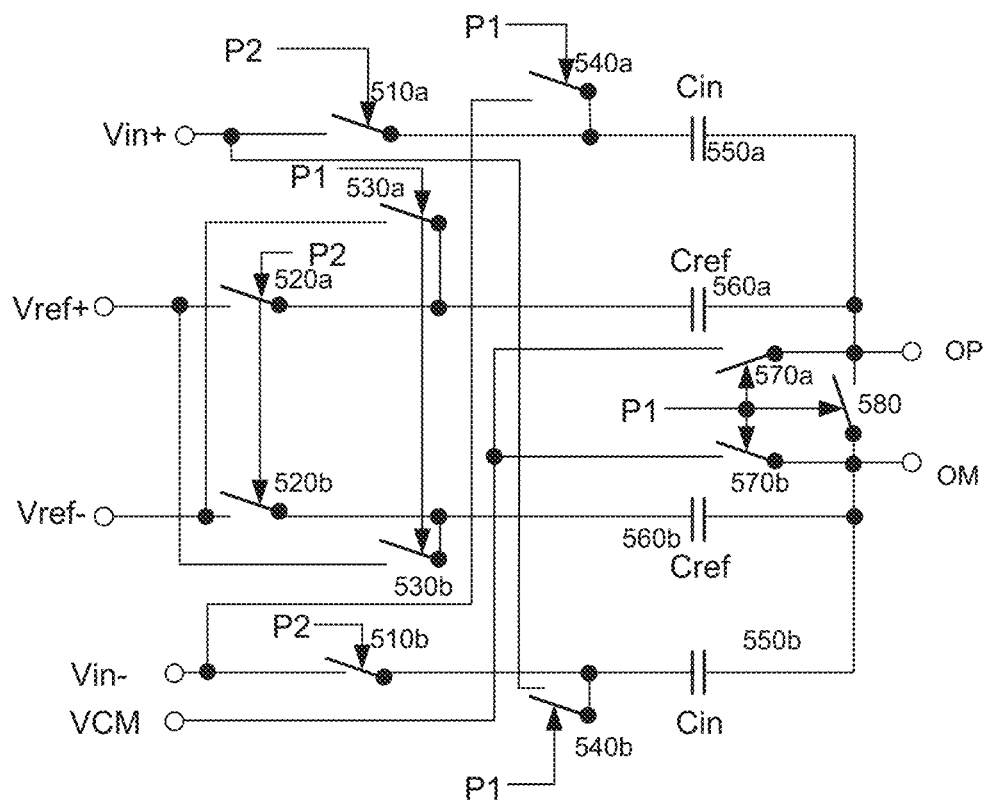
FIG. 5 shows an input stage for a sigma delta modulator according to a second embodiment.

FIG. 5 shows an exemplary embodiment of a circuit where the gain factor of 2× is realized in the Vin path with the cross configuration. Switch 510a connects Vin+ with the first terminal of capacitor 550a whose second terminal is coupled with output OP. Switch 520a connects Vref+ with the first terminal of capacitor 560a whose second terminal is coupled with output OP. Switch 520b connects Vref− with the first terminal of capacitor 560b whose second terminal is coupled with output OM. Switch 510b connects Vin− with the first terminal of capacitor 550b whose second terminal is coupled with output OM. Switch 540a connects Vin− with the first terminal of capacitor 550a and switch 540b connects Vin+ with the first terminal of capacitor 550b. Switches 570a and 570b are provided to couple the outputs OP and OM with VCM and switch 580 shorts outputs OP and OM. Switch 530a is provided to connect Vref− to the first terminal of capacitor 560a and switch 530b is provided to connect Vref+ with the first terminal of capacitor 560b. Switches 540a, b, 530a, b, 570a, b, and 580 are controlled by clock signal P1. Switches 510a, b and 520a, b are controlled by clock signal P2.

What is claimed is:

1. An input stage for a switched capacitor analog-to-digital converter, comprising
    a differential voltage input receiving an input voltage;
    a differential reference voltage input receiving a chopped reference voltage;
    a common voltage connection;
    a differential output;
    a pair of input capacitors coupled between the differential voltage input and the differential output;
    a pair of reference capacitors coupled between the differential reference voltage input;
    a switching unit controlled by a first and second phase operable
        during the first phase to connect a first terminal of the input capacitors with the common voltage connection and couple the first terminal of the reference capacitors with the inverted differential voltage reference; and
        during a second phase to connect the first terminal of the input capacitors with the differential input voltage and couple the first terminal of the reference capacitors with the non-inverted differential voltage reference,
    wherein the first and second phase are defined by non-overlapping clock signals.

2. The input stage according to claim 1, wherein the reference voltage is chopped using the non-overlapping clock signals.

3. The input stage according to claim 2, wherein the reference voltage comprises a positive offset voltage during one phase and a negative offset voltage during the other phase.

4. The input stage according to claim 1, wherein during the first phase the second terminals of the input capacitors are coupled with a common voltage connection.

5. The input stage according to claim 1, wherein during the first phase the second terminals of the input capacitors are coupled with a negative input voltage.

6. The input stage according to claim 1, wherein the first terminal of a positive input capacitor and the first terminal of a positive reference capacitor are coupled with a positive output terminal and the first terminal of a negative input capacitor and the first terminal of a negative reference capacitor are coupled with a negative output terminal.

7. The input stage according to claim 1, wherein common voltage connection is ground.

8. The input stage according to claim 1, wherein common voltage connection is a virtual ground.

9. A method of providing an input signal to a quantizer of a sigma delta modulator having an input stage with a pair of input capacitors and a pair of reference capacitors, wherein a first terminal of each of the input capacitors and reference capacitors is connected with a positive and negative output terminal, respectively, the method comprising:
    during a first phase connecting the positive and negative output terminals with a common voltage and charging the reference capacitors with an inverted reference voltage; and
    during a subsequent second phase disconnecting the positive and negative output terminals from the common voltage and connecting the first terminals of the input capacitors with a non-inverted differential input voltage, respectively and the first terminals of the reference capacitors with the non-inverted reference voltage,
    wherein the first and second phase are defined by a non-overlapping clock signals.

10. The method according to claim 9, wherein the reference voltage is chopped using the non-overlapping clock signals.

11. The method according to claim 10, wherein the reference voltage comprises a positive offset voltage during one phase and a negative offset voltage during the other phase.

12. The method according to claim 9, wherein during the first phase the second terminals of the input capacitors are coupled with the common voltage.

13. The method according to claim 9, wherein during the first phase the second terminals of the input capacitors are coupled with an inverted input voltage.

14. The method according to claim 9, wherein common voltage connection is ground.

15. The method according to claim 9, wherein common voltage connection is a virtual ground.

* * * * *